(12) United States Patent
Zundel

(10) Patent No.: US 8,274,109 B2
(45) Date of Patent: Sep. 25, 2012

(54) SEMICONDUCTOR DEVICE WITH DYNAMICAL AVALANCHE BREAKDOWN CHARACTERISTICS AND METHOD FOR MANUFACTURING A SEMICONDUCTOR DEVICE

(75) Inventor: Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 616 days.

(21) Appl. No.: 11/964,292

(22) Filed: Dec. 26, 2007

(65) Prior Publication Data

US 2009/0166720 A1 Jul. 2, 2009

(51) Int. Cl.
*H01L 29/732* (2006.01)
(52) U.S. Cl. ............................. 257/328; 257/E29.257
(58) Field of Classification Search .................. 257/328, 257/E29.257
See application file for complete search history.

(56) References Cited

U.S. PATENT DOCUMENTS

| | | | |
|---|---|---|---|
| 3,723,901 A * | 3/1973 | Nicolas | ............................ 331/65 |
| 6,710,403 B2 | 3/2004 | Sapp | |
| 6,764,889 B2 * | 7/2004 | Baliga | ............................ 438/197 |
| 6,870,220 B2 * | 3/2005 | Kocon et al. | .................. 257/340 |
| 2003/0173618 A1 | 9/2003 | Zundel et al. | |
| 2005/0082591 A1* | 4/2005 | Hirler et al. | .................... 257/302 |
| 2006/0258105 A1 | 11/2006 | Zundel et al. | |
| 2007/0138544 A1 | 6/2007 | Hirler et al. | |

FOREIGN PATENT DOCUMENTS

DE 10 2005 041 358 A1 3/2007

* cited by examiner

*Primary Examiner* — Thao Le
*Assistant Examiner* — Tanika Warrior
(74) *Attorney, Agent, or Firm* — Dickstein Shapiro LLP

(57) ABSTRACT

A semiconductor device includes a semiconductor substrate having at least a pn-junction arranged in the semiconductor substrate. At least a field electrode is arranged at least next to a portion of the pn-junction, wherein the field electrode is insulated from the semiconductor substrate. A switching device is electrically connected to the field electrode and adapted to apply selectively and dynamically one of a first electrical potential and a second electrical potential, which is different to the first electrical potential, to the field electrode to alter the avalanche breakdown characteristics of the pn-junction.

20 Claims, 8 Drawing Sheets

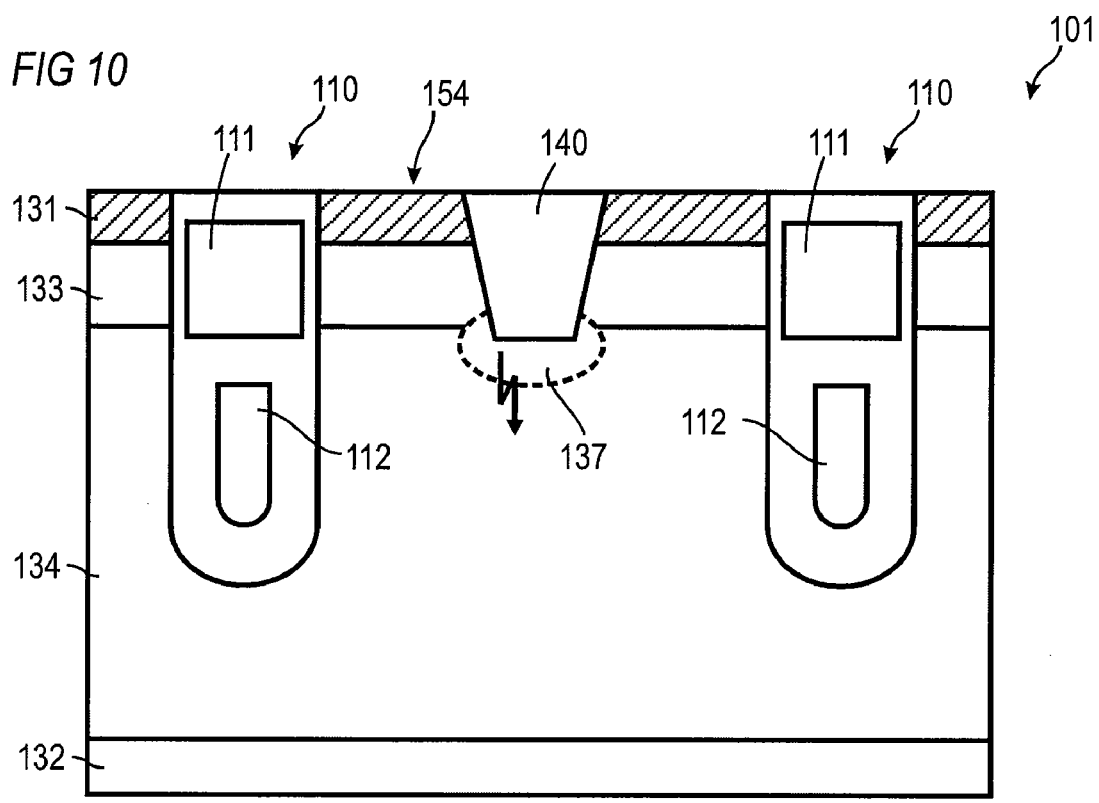
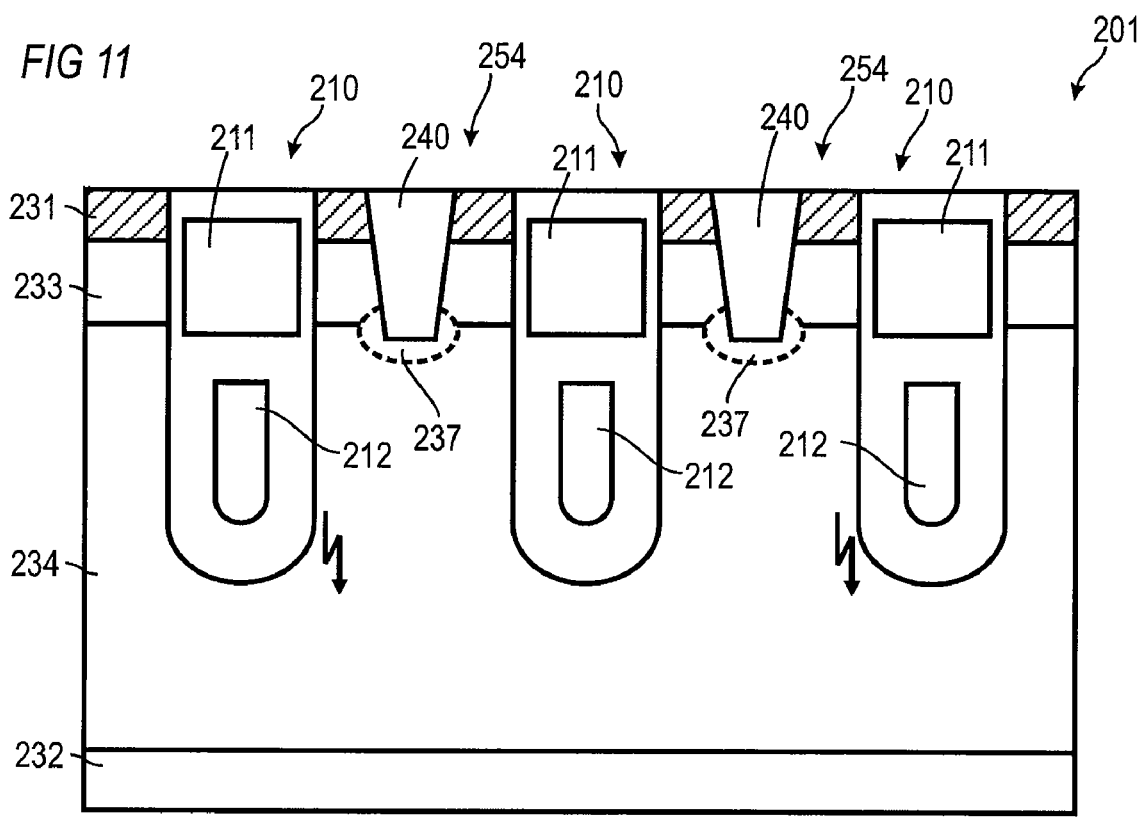

SEMICONDUCTOR DEVICE WITH DYNAMICAL AVALANCHE BREAKDOWN CHARACTERISTICS AND METHOD FOR MANUFACTURING A SEMICONDUCTOR DEVICE

FIELD OF THE INVENTION

This description refers to embodiments of semiconductor devices and particularly power semiconductor devices with improved avalanche breakdown characteristics. Further embodiments refer to a method for operating a semiconductor device and a method for manufacturing a semiconductor device.

BACKGROUND OF THE INVENTION

Improvement of reliability and robustness of semiconductor devices is an ongoing aim in the development of semiconductor device and particularly power semiconductor devices. To ensure that devices which were delivered to customer meet the demands, the semiconductor devices are subjected to extended reliability tests before delivery. For example, the properties of the semiconductor device during an avalanche breakdown influence the reliability and are therefore subject for further developments. Transient avalanche breakdowns frequently occur in demanding applications and can render a device useless.

Two main device concepts having different avalanche properties are commonly used—the field electrode concept and the dense trench concept. In semiconductor devices of the field electrode concept, the avalanche breakdown occurs close to the contact plug for contacting the body region. Different thereto, the location of the breakdown is arranged close to the bottoms of the trenches in semiconductor devices formed according to the dense trench concept. While semiconductor devices of the trench dense concept exhibit improved properties regarding on-state resistance in comparison with standard devices of the field electrode concept, dense trench devices are more susceptible to avalanche breakdowns.

BRIEF SUMMARY OF THE INVENTION

According to an embodiment, a semiconductor device is provided. The semiconductor device includes a semiconductor substrate having at least a pn-junction arranged in the semiconductor substrate. At least a field electrode is arranged at least next to a portion of the pn-junction, wherein the field electrode is insulated from the semiconductor substrate. A switching device is electrically connected to the field electrode and adapted to apply selectively and dynamically one of a first electrical potential and a second electrical potential, which is different to the first electrical potential, to the field electrode to alter the avalanche breakdown characteristics of the pn-junction.

During operation, the semiconductor device can be brought into different modes of operation by selectively switching between two different electrical potentials applied to the field electrode. This influences the location of a possible avalanche breakdown so that the breakdown behaviour of semiconductor device can be switched.

BRIEF DESCRIPTION OF THE SEVERAL VIEWS OF THE DRAWINGS

A full and enabling disclosure of the present invention, including the best mode thereof, to one of ordinary skill in the art, is set forth more particularly in the remainder of the specification, including reference to the accompanying figures. Therein:

FIG. 10 shows a reference semiconductor device.

FIG. 11 shows another reference semiconductor device.

DETAILED DESCRIPTION OF THE INVENTION

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only.

The term "lateral" as used in this specification intends to describe an orientation parallel to the main surface of a semiconductor wafer or die.

The term "vertical" as used in this specification intends to describe an orientation which is arranged perpendicular to the main surface of the semiconductor wafer or die.

The term "above" as used in this specification describes a location of a structural feature which is arranged closer to the first surface in relation to another structural feature.

Consequently, the term "below" as used in this specification describes a location of a structural feature which is arranged closer to the second surface in relation to another structural feature.

Specific embodiments described in this specification pertain to, without being limited thereto, power semiconductor devices such as diodes and particularly to devices which are controlled by field-effect such as power field-effect transistors (FETs) and insulated gate bipolar transistors (IGBTs).

Figure 1A:
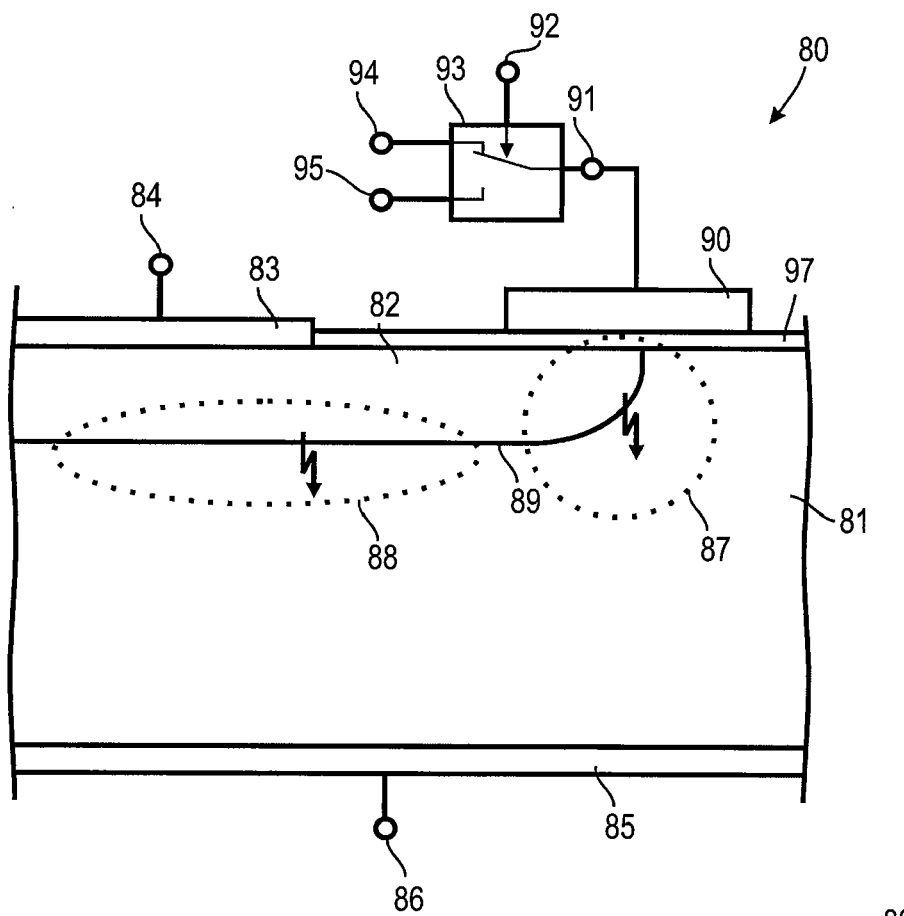
FIGS. 1A and 1B show embodiments of semiconductor devices.

FIG. 1A shows a semiconductor device 80 according to a first embodiment. The semiconductor device 80 includes an appropriate semiconductor substrate 81 such as silicon or silicon carbide having a pn-junction 89 formed therein. The pn-junction 89 is formed between two regions of opposite conductivity type. In the embodiment shown in FIG. 1A the pn-junction 89 is formed between a doping region 82 arranged in the semiconductor substrate 81 and an adjoining region of the semiconductor substrate 81 of opposite type. Doping region 82 is arranged on a surface of the semiconductor substrate 81. For example, semiconductor substrate 81 can be n-doped while doping region 82 can be p-doped. Doping region 82 is contacted by a contact layer 83 arranged on one side of the semiconductor substrate 82 and having a terminal 84. On the opposite side of the semiconductor substrate 81 a further contact layer 85 is formed for contacting the semiconductor substrate 81. Further contact layer 85 also has a terminal 86. Embodiment of FIG. 1A may represent a diode such as a power rectifier.

Pn-junction 89 has in this embodiment at least two regions. Region 88, circled by a dotted line, forms a flat or straight junction while region 87, circled by a dotted line, is curved. Curved pn-junction is formed on a peripheral portion, more specifically at a laterally peripheral portion, of doping region 82. The region 87, where the pn-junction 89 is curved, is susceptible to an avalanche breakdown when operated in reverse mode, since the electrical field under reverse condition is inhomogeneous there. Therefore, region 87 is likely to experience an avalanche breakdown in reverse mode. Due to the curvature of region 87, the avalanche breakdown may occur at a voltage which is smaller than the volume breakdown voltage of the semiconductor substrate 81.

To avoid an avalanche breakdown at low reverse voltages a field electrode 90 is arranged next to the curved region 87 of pn-junction 89. Field electrode 90 is insulated from the semiconductor substrate 81 by an insulating layer 97 to avoid short-circuiting of pn-junction 89.

The field electrode 90 is electrically connected to an output terminal 91 of a switching device 93, which has two input terminals 94 and 95 and a control terminal 92. The switching device 93 allows a selective connection of the field electrode 90 with one of two different electrical potentials fed to the respective input terminals 94, 95. For example, one electrical potential can be the electrical potential of the doping region 82, and the other electrical potential can be the electrical potential of the semiconductor substrate 81 under reverse conditions. In certain embodiments, input terminal 94 can be connected to terminal 84 of contact layer 83 for contacting the doping region 82, while input terminal 95 can be connected to terminal 86 of contact layer 85.

For example, when applying the electrical potential fed to doping region 82 to the field electrode 90 under reverse condition, the electrical field formed between the doping region 82 and the semiconductor substrate 81 is at least partially pushed out of the breakdown-susceptible region 87 and the likelihood is reduced that a breakdown will occur in region 87. When appropriately selecting the layout and arrangement of the field electrode 90 and the electrical potential applied thereto, the electrical breakdown characteristics of the semiconductor device 80 can be altered such that the likelihood, that a breakdown will occur in curved region 87, is lower than the likelihood for a breakdown in the straight or flat region 88. Switchable field plate 90 therefore allows a change of the electrical breakdown characteristics of the semiconductor device 80 when operated under reverse condition. In other words, the semiconductor device 80 can be switched between two different breakdown regimes. The respective electrical potentials can be applied in an alternating manner with a given duty cycle.

Figure 1B:
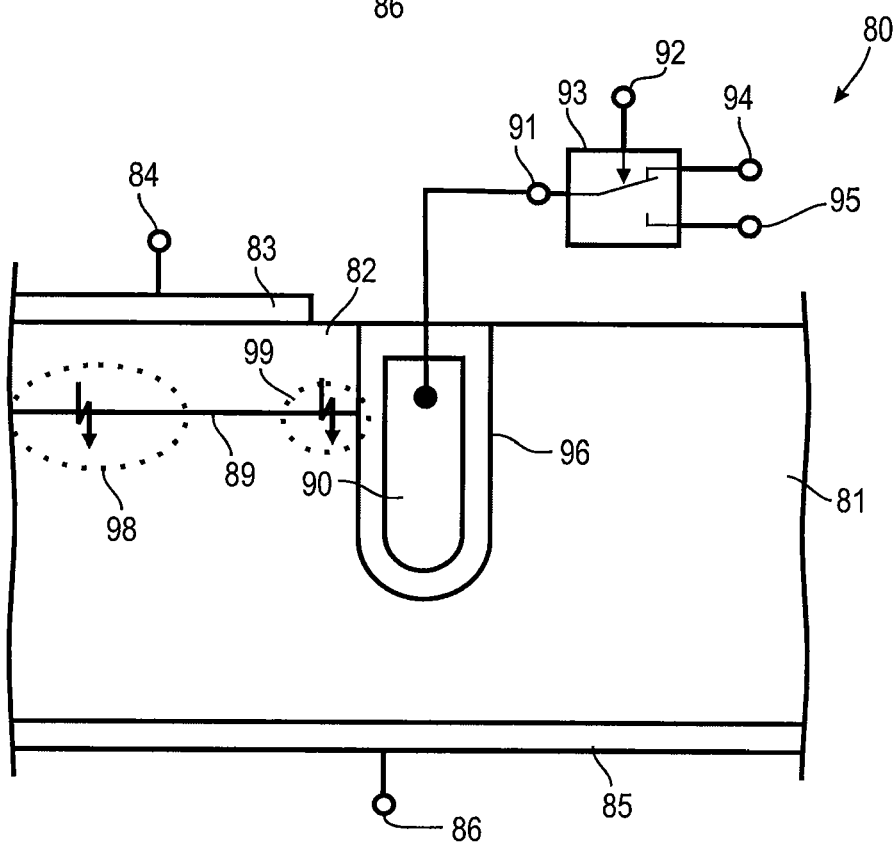

FIG. 1B shows another embodiment of semiconductor device 80 having a trench 96 arranged in the semiconductor substrate 81 next to pn-junction 89. Trench 96 accommodates the field electrode 90. As in the embodiment shown in FIG. 1A, field plate 90 is switchable between two electrical potentials by switching device 93.

Field electrode 90 can be used to switch between different avalanche breakdown regions which are circled in FIG. 1B by dotted lines 98 and 99, respectively. A breakdown would occur in region 98 if source potential is applied to field electrode 90. Different thereto, a breakdown would occur in region 99 if drain potential is applied to field electrode 90 since this increases the electrical field density close to region 99.

Switching device 93 can be integrated in the semiconductor substrate 81 or formed separately thereto. In the latter case, a control contact pad, which is in electrical connection with field electrode 90, is formed on the semiconductor substrate 81 to allow an external connection of field electrode 90 with the output terminal 91 of the switching device 93. Terminals 84 and 86 are also typically formed by appropriate contact pads.

When the switching device 93 is integrated in the semiconductor substrate 81, a separate contact pad can be provided to allow external connection to control terminal 92 of the switching device 93. In this case, input terminals 94, 95 of the switching device 93 are typically connected to terminals 84 and 86, respectively. This provides for an external control of the switching device 93 and the field electrode 90 without the need of providing separately the electrical potentials. It would, however, also be possible to provide contact pads in electrical connections with the input terminals 94, 95 of the switching device 93 to apply externally respective electrical potentials.

When considering the planar device as shown in FIG. 1A, the field electrode 90 is typically formed after formation of the pn-junction 89, while in the trench device as shown in FIG. 1B, field electrode 90 is typically formed before forming the pn-junction 89. Typically, both devices can include a back metallization formed by contact layer 85 and a front metallization formed by contact layer 84.

Figure 2:
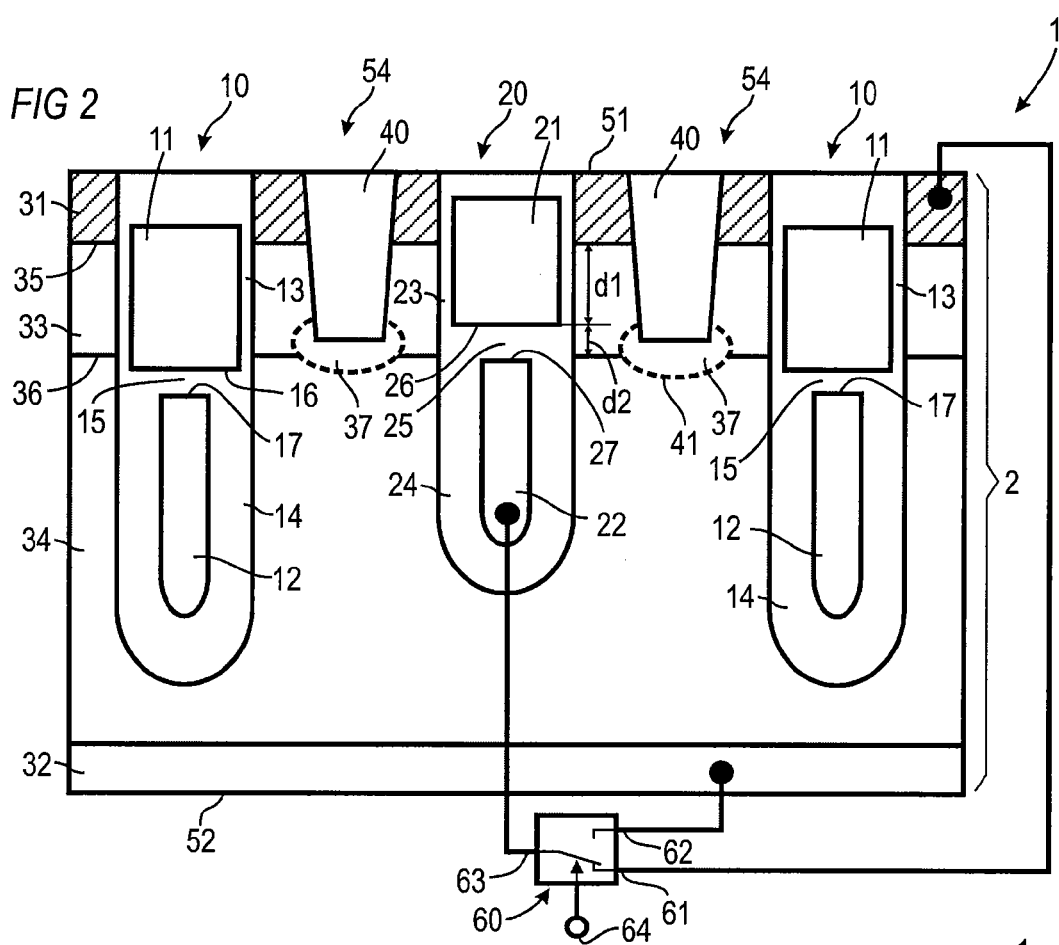
FIG. 2 shows another embodiment of a semiconductor device.

With reference to FIG. 2, a further embodiment of a semiconductor device is described. The semiconductor device 1 includes a semiconductor substrate 2 which can be made of silicon, silicon carbide, III-V semiconductor material, II-VI semiconductor material, heterojunction semiconductor material or any other suitable semiconductor material. The semiconductor substrate 2 can include a single crystal material and at least one epitaxial layer formed thereon. In a typical application, the free surface of the epitaxial layer forms a first surface 51 and the free surface of the single crystal material forms a second surface 52 of the semiconductor substrate 2. The first and second surfaces 51 and 52 are arranged opposite to each other and run substantially lateral. The term single crystal material as used herein refers to a wafer formed by cutting a slice for instance from a single-crystal ingot or boule. On the single crystal material, at least an epitaxial layer can be formed by any suitable deposition process. Alternatively, a wafer without any additional epitaxial layer can be used as semiconductor substrate 2. Furthermore, a semiconductor substrate 2 formed by bonding two wafers can also be used. Particularly for, but not limited to, power semiconductor devices the semiconductor substrate 2 includes a single-crystal material and an epitaxial layer formed thereon which allows fine adjustment of the doping concentration of the epitaxial layer during deposition according to specific needs. In most applications silicon or silicon carbide are used as material for the semiconductor substrate 2.

A first doping region 31 is arranged in the semiconductor substrate 2 at the first surface 51. The first doping region 31 typically serves as source region and is of a first conductivity type. In many applications, the first or source region 31 is highly n-doped, typically in the range from about $1*10^{19}/cm^3$ to about $1*10^{21}$/cm$^3$. In the following description, the first doping region 31 is referred to as source region 31 without being limited thereto.

At the second surface 52, a second doping region 32 is arranged in the semiconductor substrate 2. In case of a FET-transistor, the second doping region 32 is a drain region having the same conductivity type as the source region 31. Contrary thereto, in case of an IGBT the second doping region 32 forms an emitter region which is of opposite conductivity to the source region 31. The power semiconductor devices as described herein such as power FETs and IGBTs are designed to have a characteristic vertical load current which flows from the source region 31 to the drain or to the emitter region 32, respectively. In a typical application, the drain or emitter region 32 is highly doped in the range from about $1*10^{19}$/cm$^3$ to about $1*10^{21}$/cm$^3$. In the following description, the second doping region 32 is referred to as drain region 32 without being limited thereto. In case of an IGBT, the second doping region 32 is referred to as emitter region.

A third doping region 33 is arranged in the semiconductor substrate 2 in contact with the source region 31. The third doping region 33 typically forms a body region and has a conductivity type opposite to the source region 31 so that a first pn-junction 35 is formed between the source region 31 and the third doping region 33. The doping concentration of the third doping region 33 is typically p-doped in the range from about $5*10^{16}$/cm$^3$ to about $5*10^{18}$/cm$^3$. In the following description, the third doping region 33 is referred to as body region 33 without being limited thereto.

A fourth doping region 34 is arranged between the body region 33 and the drain region 32 and typically forms a drift region having the same conductivity type as the source region 31. The doping concentration of the fourth doping region 34 substantially corresponds to the background doping concentration of the semiconductor substrate 2 or the epitaxial layer if one is used. However, the doping concentration of the fourth doping region 34 can also exhibit a doping profile having a maximum or a minimum at a desired location or an increasing or decreasing doping concentration in vertical direction. Tailoring the doping profile of the fourth doping region 34 helps to improve the breakdown and on-state characteristics of the semiconductor device 1. Typically, the doping concentration of the fourth doping region 34 is in the range from about $1*10^{15}$/cm$^3$ to about $5*10^{17}$/cm$^3$. The fourth doping region 34 is in direct contact with the body region 33 and forms with it a second pn-junction 36. In the following description, the fourth doping region 34 is referred to as drift region 34 without being limited thereto.

At least a first trench 10 is arranged in the semiconductor substrate 2 and extends from the first surface 51 into the semiconductor substrate 2 towards the second surface 52 with the bottom of the trench 10 being spaced to the second surface 52 and particularly to the drain region 32 in case of an FET or to the emitter region 32 in case of an IGBT. Laterally spaced to the first trench 10 is arranged a second trench 20 which also extends from the first surface 51 into the semiconductor substrate 2. In this embodiment, a further first trench 10 is formed in the semiconductor substrate 2 in spaced relation to the second trench 20 so that the second trench 20 is arranged between the two first trenches 10. The portions of the semiconductor substrate 2 left between adjacent trenches are referred to as mesa structures 54. The first and second trenches 10, 20 run vertically and substantially perpendicularly to the first surface 51.

In some embodiments, the semiconductor device 1 includes a first and a second trench. In other embodiments the semiconductor device includes two first trenches 10 and a second trench 20 arranged between the two first trenches 10. In further embodiments, at least three first trenches 10 and at least one second trench 20 are provided with the second trench being arranged between two of the three first trenches 10. In many applications, selective trenches are formed as second trenches 20, for example every second, third, fourth or every fifth trench. Other ratios would also be possible.

In this embodiment, first trenches 10 are shown to have a greater vertical extension than the second trench 20. As becomes more apparent in connection with other embodiments, all trenches 10, 20 can also have the same vertical extension.

The first trench 10 includes a gate electrode 11 and a field electrode 12 which both are arranged in the first trench 10 with the gate electrode 11 being arranged above the field electrode 12 in proximity to the first surface 31. The gate electrode 11 extends vertically, i.e. parallel to the vertical extension of the first trench 10, from the source region 31 to the drift region 34. Since the body region 33 is arranged between the source region 31 and the drift region 34, the gate electrode 11 of the first trench 10 extends completely through the body region 33.

It is worth mentioning that gate electrode and field electrode are different from each other and serve different purposes. A gate electrode is arranged close to two different pn-junctions separated by a channel forming region often referred to as body region. The gate electrode is for generating a conductive channel in the channel forming region to provide an electrical path across the two pn-junctions. Different thereto, a field electrode is arranged close to only one pn-junction or even remote to a pn-junction so that it is not adapted to form a conductive channel. The main purpose of a field electrode is to influence the distribution of the electrical field, typically in a drift region, to change and define the breakdown characteristic of the device.

A gate insulating layer 13, sometimes referred to as gate oxide layer (GOX), is arranged between the gate electrode 11 and the semiconductor substrate 2 and particularly between the gate electrode 11 and the body region 33.

A field insulating layer 14, typically a field oxide (FOX), is arranged between the field electrode 12 and the semiconductor substrate 2, particularly the drift region 34, and insulates the field electrode 12 form the drift region 34. The field oxide layer 14 has a significant greater thickness in comparison with the gate insulating layer 13 to withstand high electrical field strengths occurring during operation of the semiconductor device 1 and to avoid electrical breakdown between the field electrode 12 and the drift region 34 as it becomes more apparent from the description below.

A gate-field insulating layer 15, sometimes referred to as POLOX (Polyoxide), is arranged between the gate electrode 11 and the field electrode 12.

The second trench 20 also includes a gate electrode 21 and a field electrode 22 with the gate electrode 21 being arranged above the field electrode 22. Similar to the first trench 10, the gate electrode 21 is laterally insulated from the semiconductor substrate 2 by a gate insulating layer 23 while the field electrode 22 is insulated from the semiconductor substrate 2 by a field insulating layer 24. Furthermore, a gate-field insulating layer 25 insulates the gate electrode 21 from the field electrode 22.

The trench 10, 20 define respective separate cells of the semiconductor device 1 which are electrically connected in parallel to each other to increase the available cross-section for the load current and to reduce the on-state resistance.

A contact region 40 is formed in the semiconductor substrate 2 at the first surface 51 between adjacent trenches 10, 20. Typically, the contact region 40 is a groove filled with a highly conductive material. Contact region 40 can be manufactured by etching a groove, forming an optional barrier layer (not shown) such as a silicide layer on the groove walls, and filling the groove with the conductive material, which can be highly doped polysilicon or a metal. Before filling the groove or forming the optional barrier layer, a highly doped region 37 having the same conductivity type as the body region 33 can be formed by shallow implantation. Highly doped region 37 can have a vertical extension of about a 10 to 120 nm. In the Figures, the vertical extension of region 37 is exaggerated. The groove accommodating the contact region can have a vertical extension of about 200 to 1500 nm depending on the actual design of the semiconductor device. The contact region 40 is sometimes referred to as poly plug since it is typically made of highly doped polysilicon. The highly doped region 37 typically defines the lower end 41 of the contact region 40.

The semiconductor device 1 further includes a switching device 60 having an output terminal 63 and a first and a second input terminal 61 and 62, respectively. Furthermore, the switching device 60 includes a control terminal 64. The first input terminal 61 is connected to the source region 31 while the second input terminal 62 is connected to the drain region 32. The output terminal 63 is connected to the field electrode 22 of the second trench 20. The operation of the switching device 60 can be controlled by applying a suitable control signal to the control terminal 64.

The purpose of the switching device 60 is to change dynamically the electrical potential of the second trench's field electrode 22. Typically, the electrical potential applied to the field electrode 22 is switched between a first electrical potential and a second electrical potential to change the electrical breakdown characteristics of the semiconductor device 1. The first electrical potential typically substantially corresponds to the electrical potential which is applied to the source region 31. The second electrical potential typically substantially corresponds to the electrical potential which is applied to the drain or emitter region 32 during operation. Although FIG. 2 shows that there is a direct electrical connection between the switching device 60 and the source region 31 and the drain region 32, respectively, a skilled person will appreciate that each electrical connection has a given resistivity and that at least for this reason the electrical potential applied to the source region 31 and to the field electrode 22 can differ from each other. Moreover, the switching device 60, which can be for instance designed as an integrated circuit, also exhibits an internal resistance. Furthermore, the electrical connections and the field electrode 22 have a given capacitance which results in a given time constant for charging the electrical connections and the field electrodes. Depending on the time constant and the duration of the temporal application of the second electrical potential, the field electrode of the second trench may not fully reach the first or second electrical potential. In certain embodiments the switching device can therefore be electrically connected to the field electrode of the second trench and adapted to selectively and dynamically switch the field electrode of the second trench between two different electrical potentials.

By changing the electrical potential of the field electrode 22 of the second trench 20, the semiconductor device 1 can be switched between two modes of operation with respect to the avalanche breakdown characteristics. During normal mode of operation, the field electrode 22 is roughly at source potential, and the second trench 20 has the same electrical properties as the adjacent first trenches 10, the field electrodes of which 12 are typically permanently clamped at source potential. Therefore, field electrode of the first trench is typically permanently electrically connected to the first doping region in certain embodiments.

Figure 4A:
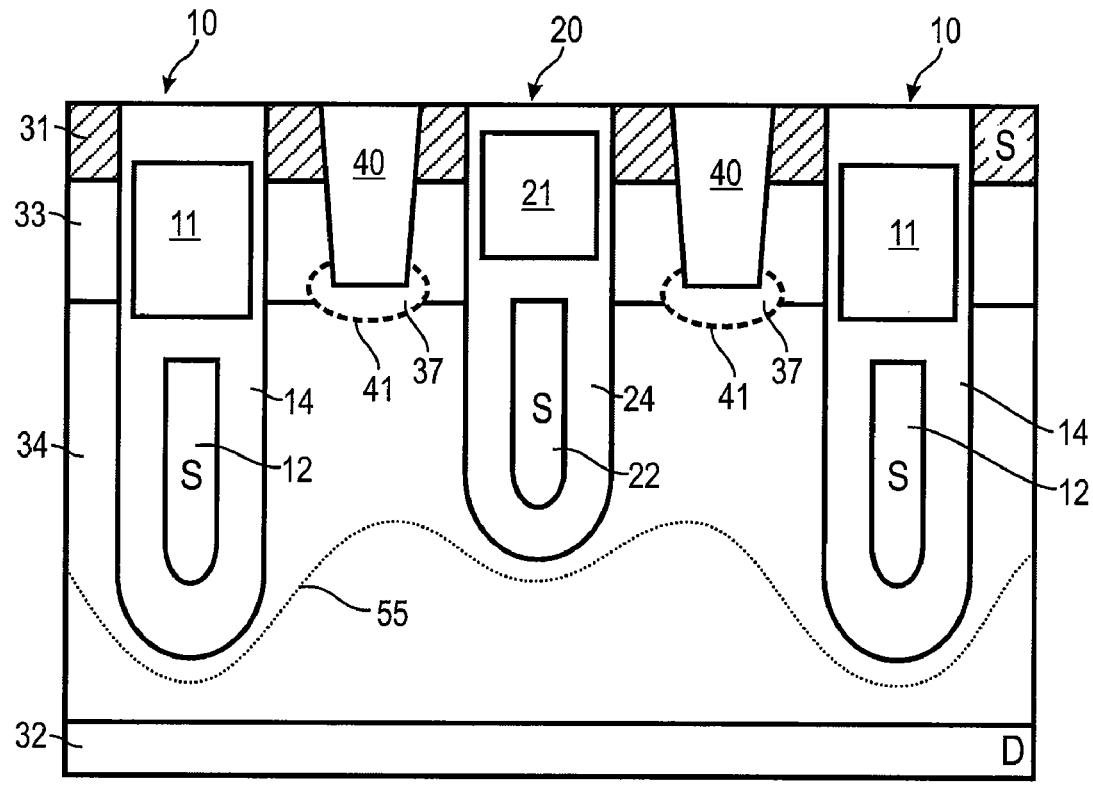
FIGS. 4A and 4B show two different modes of operation of a semiconductor device.
Figure 4B:
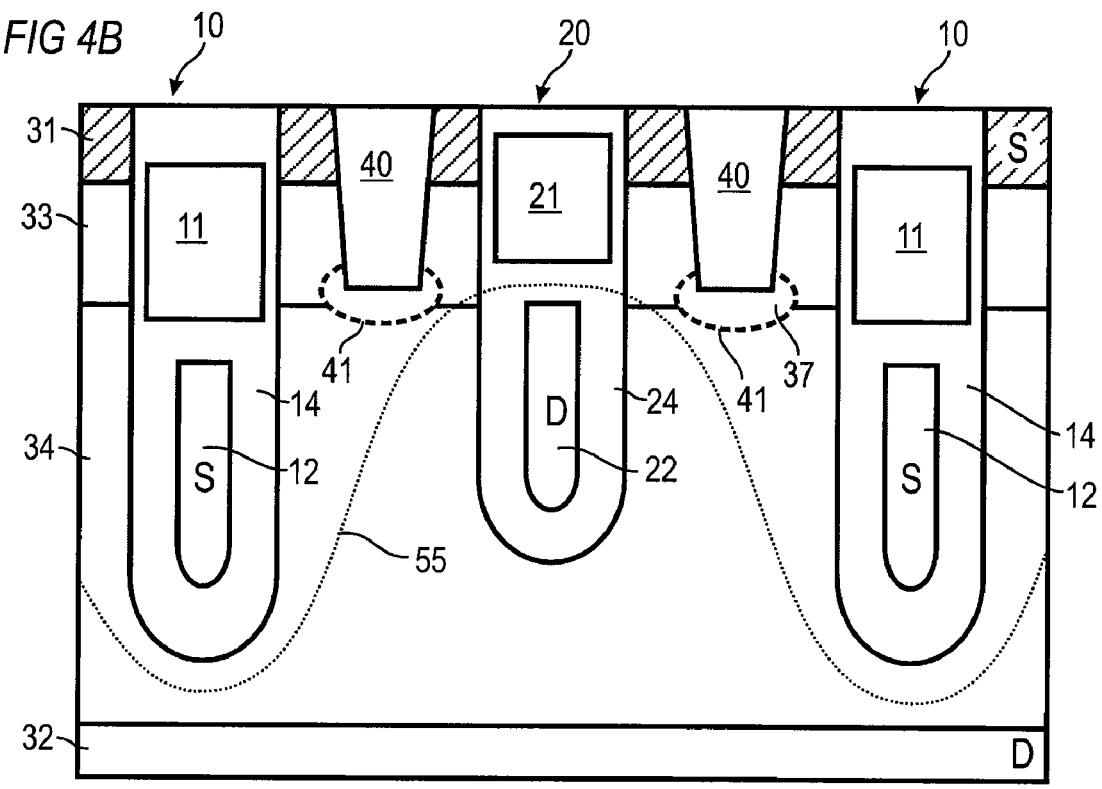

To illustrate the electrical properties of the semiconductor device 1 and the influence of the electrical potential applied to the field electrodes 12, 22 the course of iso-electrical potential lines can be considered. FIGS. 4A and 4B qualitatively exemplify this for different modes of operation when operated under reverse conditions.

FIG. 4A shows the semiconductor device 1 in reverse mode, at which all field electrodes 12, 22 are substantially at source potential. The drain region 32 is at drain potential, and the main drop of the electrical field between the source and the drain regions 31, 32 occurs in the drift region 34. For the sake of simplicity, the operation of the semiconductor device is explained with reference to a Power FET, but would be in principle the same for an IGBT and other field controlled devices. The applied electrical potentials are indicated by letters S and D with S referring to source potential and D to drain potential.

The common electrical potential of all field electrodes 12, 22 causes the electrical field to be "pushed" out of the mesa structures 54 towards the drain region 32 so that the main drop of the electrical field occurs remote to the body region 33 and the contact regions 40. This situation is schematically illustrated in FIG. 4A, and an avalanche breakdown would likely to occur close to the bottoms of the trenches 10, 20 as explained in more detail below in connection with a reference structure as shown FIG. 11. An exemplified iso-electrical potential line is denoted by 55.

To avoid an avalanche breakdown close to the bottoms of the trenches 10, 20 the electrical 'behaviour' of the second trench 20 is changed by temporarily applying the drain potential D to the field electrode 22. By doing so, second trench 20 'disappears' in relation to its influence to push out the electrical field. In fact, since the field electrode 20 of the second trench 20 is now at drain potential D, the drain potential and therefore the electrical field can deeply penetrate the drift region 34 and the mesa structures 54 adjacent to the second trench 20 and comes close to the contact region 40 so that an avalanche would now likely to occur close to the contact region 40 and remote to the field oxides 14, 24 of the first and second trenches 10 and 20, respectively. On the other hand, the electrical potential of the field electrodes 12 of the first trenches 10 remain at source potential S since the field electrode 12 is permanently electrically connected to the source region 31. FIG. 4B schematically shows the situation when the drain potential D is applied to the field electrode 20 while keeping the field electrodes 12 at source potential S.

In a typical application, the switching device 60 selectively connects the field electrode 22 of the second trench 20 with one of the source and the drain regions 31 and 32, respectively. More particularly, the field electrode 22 is temporarily connected to the drain region 32 in the event of an avalanche breakdown. For this reason, the second trench 20 is referred to as switchable trench in this description.

In many power applications, so-called repetitive avalanche breakdowns occur which are caused by the external load to which the power semiconductor device 1 is connected. These avalanche breakdowns or avalanche pulses regularly happen with a given frequency. The switching device 60 can be arranged to apply the drain voltage at the repetitive avalanche breakdown frequency. Alternatively, a suitable periodic control signal can be applied to the control terminal 64 of the switching device 60 to effect the switching.

Another option would be to monitor the drain voltage and to cause the switching device 60 to apply the drain potential to the field electrode 22 of the second trench 20 when the drain voltage exceeds a given threshold since the drain voltage rises shortly before occurrence of a breakdown. To this end, a suitably fast monitoring device (not shown) should be used which is capable of accurately detecting approaching and recurring breakdowns.

In order to switch at the repetitive avalanche frequency, the switching device 60 is adapted to apply the drain potential for a period between about some hundred nanoseconds to about some tens milliseconds. Furthermore, when monitoring the drain voltage, a threshold voltage can be defined which triggers the switching device 60 to apply the drain potential to the second trench's field electrode 22.

Using a switching device 60 also provides for a modification of the dependency of the gate-drain capacitance (Cgd) from the drain-source voltage (Vds). When the pulse rate of the avalanche breakdown pulses are known for a specific application, the Cgd(Vds) dependency can be influenced by controlled switching of the electrical potential. For example, if a slow drop of the gate-drain capacitance Cgd is desired, the drain potential should be applied at a very early stage of a repetitive avalanche pulse so that depletion of the mesa structures 54 between the trenches 10, 20 can be delayed.

Figure 9:
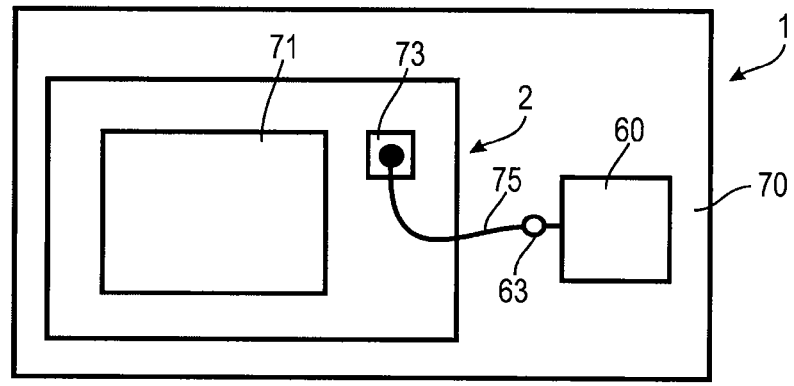
FIG. 9 shows a top view on a semiconductor device.

The switching device 60 can be arranged and formed separately to the semiconductor device 1. In this case, the semiconductor device 1 includes a control contact pad 73 which is electrically connected to the field electrode 22 so that the desired electrical potential can be externally applied to the field electrode. FIG. 9 shows a top view of a semiconductor device 1 having a source contact 71 forming a contact pad and a control contact pad 73 being separate thereto on an upper side of the semiconductor device 1. The drain or emitter contact would be on the not shown lower side of the semiconductor device 1. The output terminal 63 of the switching device 60 is electrically connected to the control contact pad 73 for instance by bond wire 75. FIG. 9 shows a switching device 60 which is formed as a separate integrated circuit, i.e. the switching device 60 is not integrated in the semiconductor substrate 2. Both the semiconductor substrate 2 and the switching device 60 can be arranged on a common substrate or board 70. There are many options for arranging the switching device 60, for instance as chip-on-chip or chip-by-chip arrangement. In the alternative case of an integrated solution, the switching device 60 can be formed as a circuit or device which is integrated in the semiconductor substrate 2, for instance at its periphery.

The improved properties of the semiconductor device 1 as described herein become even more apparent when referring to reference devices shown in FIGS. 10 and 11. These reference devices do not include a switchable trench. FIG. 10 shows a reference device 101 with largely spaced trenches 110 each having a gate and a field electrode 111 and 112, respectively. Similar to the semiconductor device 1, the reference device 101 includes a source region 131, a drain region 132, a body region 133 and a drift region 134. Body region 133 is contacted by contact region 140 arranged in the mesa structure 154 and having a highly doped region 137. Due to the large spacing between adjacent trenches 110, which significantly exceed the lateral extension of each trench 110, the electrical field can deeply penetrate the drift region 134 and extends close to the contact region 140 where an avalanche breakdown would occur. The location of a breakdown is indicated by a flash.

A semiconductor reference device 201 with closely spaced trenches 211 is shown in FIG. 11. The lateral spacing between adjacent trenches 210 is significantly smaller than the lateral spacing of the trenches 110 in FIG. 10. The semiconductor device 201 also includes a source region 231, a body region 233, a drift region 234 and a drain region 232, respectively, similar to the semiconductor device 101 of FIG. 10. Furthermore, gate electrodes 211 and field electrodes 212 are arranged in each trench 210. The electrical potential of the field electrodes 212 is permanently kept at source potential during operation so that, as explained above, the electrical field is pushed out of the mesa-structures 254. An avalanche breakdown, which is indicated by a flash, would therefore occur close to any of the bottoms of the trenches 210 where the iso-electrical potential lines are concentrated.

Both, the semiconductor device 101 and the semiconductor device 201, have a fixed location of their avalanche breakdown. Different thereto, the location of the avalanche breakdown of the semiconductor device 1 as described herein can be controlled and shifted. A beneficial aspect of the semiconductor device 1 is that it can be controlled to behave like a dense trench device under normal or forward conditions and like a device with largely spaced trenches during avalanche breakdown. To this end, the lateral extension of the trenches 10, 20 of the semiconductor device 1 is in many embodiments equal to or larger than the lateral spacing (lateral extension of the mesa structures 54) between adjacent trenches 10, 20 to maintain the dense trench regime.

By selectively applying different electrical potentials to field electrodes of selected trenches the electrical properties of these trenches and thus the characteristics of the whole device can be changed. In forward mode, the semiconductor device 1 should function as a device of the dense trench concept to make use of the reduced on-state resistance of dense trench devices. Particularly, the doping concentration of the drift region 34 can be increased in comparison with largely spaced trenches of the field electrode concept. However, the avalanche breakdown of a dense trench device as shown in FIG. 11 is located close to the field insulating layer. During an avalanche breakdown charge carriers generated in close proximity to the trench 210 flow along the trench-substrate interface either towards the body region 233 and then to the contact region 240 or towards the drain region 232 depending on their conductivity type. During this flow, the charge carriers may be scattered into the adjacent insulating layers (field insulating layer or gate insulating layer) and become trapped and accumulated in the respective insulating layers. The trapped charge carriers can cause a drift of the electrical properties of the device which could lead to a changed behaviour and eventually to a malfunction of the device.

The semiconductor device 1 as described herein avoids or at least significantly reduces accumulation of the hot charge carriers generated during avalanche breakdown since the location of the avalanche breakdown is shifted towards the contact region 40 away from the insulating layers of the trench. Particularly, the location of the avalanche breakdown associated with the repetitive avalanche breakdown occurring at substantially constant frequency and caused by external applications can be influenced. Hence, generated charge carriers flow directly either to the contact region or to the drain in sufficient distance to the trenches so that no accumulation takes place.

Basically, at least one of the trenches should be arranged to allow application of different electrical potentials. Typically, the switchable trench is arranged between two adjacent 'normal' trenches having a constant electrical potential applied to their field electrodes. The number and arrangement of the switchable trenches can be adjusted according to specific needs. In most applications, up to 50% of all trenches can be formed as switchable trenches. In other embodiments, at least 5% of all trenches are formed as switchable trenches so that a typical range is from about 5% to 50%.

It is not required that all trenches are formed as switchable trenches although the iso-electrical potential lines remain concentrated at the bottoms of all non-switched trenches in reverse mode. However, the likelihood that the actual avalanche breakdown occurs close to the contact region arranged adjacent to the switched trench is significantly larger than the likelihood that the breakdown occurs at the non-switched trenches.

For manufacturing the semiconductor device 1 as described herein and to ensure reliable operation of the device, the following may be considered.

The gate-field insulating layer 25 of the switchable trench 20 should have a sufficient thickness to withstand the large potential difference between the gate electrode 21 and the field electrode 22 when applying the drain potential to the field electrode 22. This does not necessarily apply to the gate-field insulating layer 15 of the first trenches 10. However, to simplify the manufacturing process, both gate-field insulating layers 15, 25 can be formed with the same thickness. It is, however, also possible to manufacture the switchable or second trenches 20 with a gate-field insulating layer 25 which is significantly larger than the gate-field insulating layer 15 of the first trenches 10. In case of silicon oxide as material for the gate-field insulating layer 25 the thickness of the gate-field insulating layer 25 expressed in nanometers should be approximately equal to or higher than the potential difference expressed in volt which the gate-field insulating layer 25 should withstand. For example, for a potential difference of about 50 V the gate-field insulating layer 25 should have a thickness of at least 50 nm to 60 nm.

Further, the upper edge 27 of the field electrode 22 should be arranged above the upper edge 17 of the field electrode 10 to ensure that the density of the iso-electrical potential lines is higher close to the contact region 40 than close to the bottom of the first trenches 10 even at moderate source-drain voltages. This locally increases the electrical field strength at the contact regions 40 in comparison with the field strength at the bottoms of the first trenches 10 to ensure that the breakdown will occur close to the contact region. In certain embodiments, the upper edge 27 of the field electrode 22 can be arranged above the lower edge (first pn-junction) of the body region 33.

More particularly, the upper edge 27 of the field electrode 22 of the second trench 20 should be arranged above the lower end 41 of the contact region 40 to increase even more the density of the iso-electrical potential lines close to the contact region 40. In certain embodiments, the field electrode 22 of the second trench 20 can therefore have an upper edge facing the first surface 51 and can be arranged above the lower end 41 of the contact region 40 formed in the semiconductor substrate 2 between adjacent trenches for providing an electrical connection to the body region 33.

Moreover, reducing the lateral distance of adjacent trenches decreases the density of the iso-electrical potential lines at the bottoms of the trenches. Closely spaced trenches with field electrodes at source potential avoid deep penetration of the electrical field into the mesa structures 54 and thus reduce the curvature of the electrical field at the trench's bottoms.

The above described structural features can either by embodied in separate semiconductor devices or combined in a single semiconductor device according to specific needs.

As a consequence of the increased thickness of the gate-field insulating layer 26 and the arrangement of the field electrode's upper edge arrangement, the gate electrode 21 of the second trenches 20 typically does not extend as far as the gate electrode 11 of the first trenches in vertical direction. More precisely, each gate electrode 11, 21 has a lower edge 16 and 26, respectively, which faces towards the second surface 52. The lower edge 16 of the first gate electrode 11 defines a reference plane which runs parallel to the first surface 51. The lower edge 26 of the gate electrode 21 of the second trench 20 is arranged above the reference plane. More particularly, the lower edge 26 of the gate electrode 21 is arranged above the second pn-junction 36, which corresponds to the lower edge of body region 33, and spaced to it by a distance d2. On the other hand, the lower edge 26 of the second trench's gate electrodes 21 is disposed by a distance d1 from first pn-junction 35 which corresponds to the upper edge of the body region 31. The distance d1 is typically larger than the distance d2 and the ratio between d2:d1 can be from about 1:1 to about 1:100.

This arrangement leads to an increased overlap of the gate-field insulating layer 25 of the second trench 20 and the body region 33 in vertical direction which results in an increased threshold voltage of the second trench 20. The increased threshold voltage causes a delayed formation of a conductive channel between source and drift regions 31 and 34 in comparison with the channel formation of the first trench 10 when the same voltage is applied to the gate electrodes 11, 21, respectively. Delaying channel formation improves the safe operation area (SOA) characteristic of the semiconductor device 1.

Alternatively, the thickness of the gate insulating layer 23 of the second trench 20 can be increased to even avoid channel formation when the gate voltage is applied. For example, the gate insulating layer 23 can have the same thickness as the field insulating layer 24 which would simplify the manufacturing method. When using a thick gate insulating layer 23, the gate electrode 21 of the second trench 20 can also be operated at source potential or at any other potential such as drain or gate potential or at an intermediate potential. In this case, the second trench 20 is 'inactivated' with respect to its ability to cause channel formation. In other words, each of the first and second trenches can include a gate insulating layer for electrically insulating the respective gate electrodes from the semiconductor substrate by a gate insulating layer, wherein the gate insulating layer of the second trench is thicker than the gate insulating layer of the first trench.

In both cases, the first and the second trenches 10, 20 have different threshold voltages with the threshold voltage of the second trench 20 being higher than the threshold voltage of the first trench 10. In other words the first and second trenches can include respective threshold voltages for forming a conductive channel in the body region adjacent to the respective gate electrodes, wherein the threshold voltages of the second trench is higher than the threshold voltage of the first trench.

In forward mode, the inactivated second trench 20 does not contribute to the load current between source and drain regions 31, 32. This slightly increases the overall on-state resistance defined by all cells of the power semiconductor device 1. To reduce the influence of the inactivated second trenches 20, the proportion of the second trenches 20 with respect to the first trenches 10 should be kept small.

Second trenches 20 having a structure which results in a delayed channel formation or a channel formation at higher voltages also slightly increase the overall on-state resistance but to a lesser degree than inactivated second trenches 20.

In certain embodiments, for operating the semiconductor device a first electrical potential is applied to the first doping region 31 and each of the field electrodes 12, 22 of the first and second trenches. A second electrical potential is applied to the second doping region 32. At least the field electrode 22 of the second trench 20 is temporarily disconnected from the first electrical potential and the second electrical potential is applied to the field electrode 22 of the second trench 20 while keeping the field electrode 12 of the first trench 10 at the first electrical potential. Hence, the field electrode 22 of the second trench is alternatingly connected to the first and the second electrical potential. The duty ratio for temporarily connecting the second electrical potential to field electrode 22 of the second trench 20 can be selected according to specific needs. In certain embodiments, the duty ratio is selected such to avoid avalanche breakdown near the bottoms of the trenches 10, 20 as explained above.

According to another embodiment, a semiconductor device include a semiconductor substrate 2 having a first surface 51 and a second surface 52 arranged opposite to the first surface 51, a first doping region 31 formed in the semiconductor substrate 2 at the first surface 51, a second doping region 32 formed in the semiconductor substrate 2 at the second surface 52, and a third doping region 33 in contact with the first doping region 31. The third doping region 33 is of opposite conductivity type to the first doping region 31. First doping region 31 can be a source region, second doping region 32 a drain region and third doping region 33 a body region, respectively. At least a first and a second trench 10, 20 are formed in the semiconductor substrate 2 and extend through the third doping region 33. The first and second trenches 10, 20 are laterally spaced to each other to form a mesa-structure 54 therebetween. First and second trenches 10, 20 include at least a field electrode 12, 22. A contact region 40 is formed in the mesa-structure 54 between adjacent trenches 10, 20 for providing an electrical connection to the third doping region 33. The field electrode 12 of the second trench has an upper edge 27 facing the first surface 51 and is arranged above a lower end 41 of the contact region 40. The first trench 10 can include a gate electrode 11 arranged above the field electrode 12. In addition to that, second trench can have an optional gate electrode 21 arranged above the field electrode 22. Gate electrode 21 can be electrically inactivated by arranging an at least partially thick gate insulating layer 23 between gate electrode 21 and the semiconductor substrate. Different thereto, gate electrode 11 of the first trench 10 is typically electrically active, i.e. capable of forming a conductive channel in the third semiconductor region 33 when applying an appropriate voltage to gate electrode 11. To this end, gate electrode 11 is insulated from third semiconductor region 33 by a comparable thin gate insulating layer 13. In this case, both gate electrodes 11, 21 define different threshold voltages with the threshold voltage of gate electrode 21 being large or even significantly larger than the threshold voltage of gate electrode 11. Alternatively, the gate insulating layers 13, 23 of both trenches 10, 20 can have substantially the same thickness.

Figure 3:
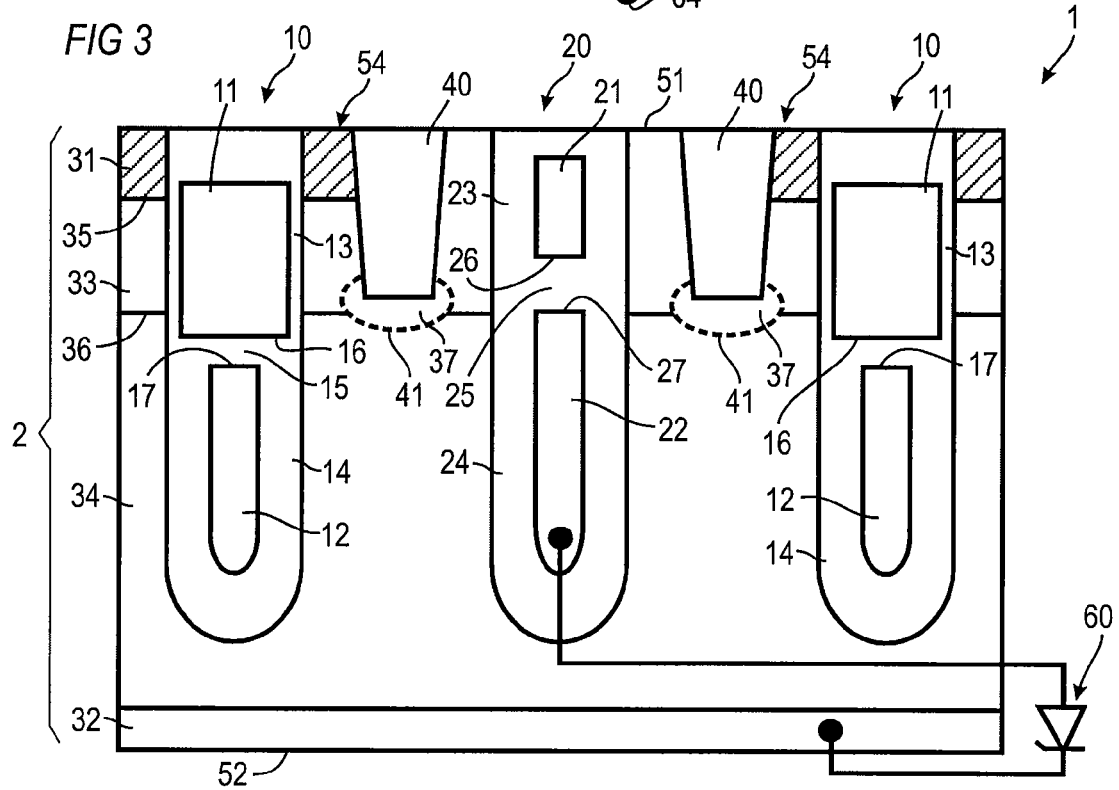
FIG. 3 shows yet another embodiment of a semiconductor device.

FIG. 3 shows an embodiment having a second trench 20 with an inactivated second trench 20 by using a thick gate insulating layer 23. Furthermore, the source region 31 is formed to be arranged in spaced relation to the second trench 20. The switching device 60 of this embodiment is a Zener diode with a Zener breakdown voltage at about 90% of the nominal drain voltage or the avalanche breakdown voltage.

The field electrodes 22 of all switchable trenches 20 can be connected to a common control contact pad 73 to which an integrated device forming the switching device 60 is connected which allows a short temporal connection to the drain potential.

Figure 5:
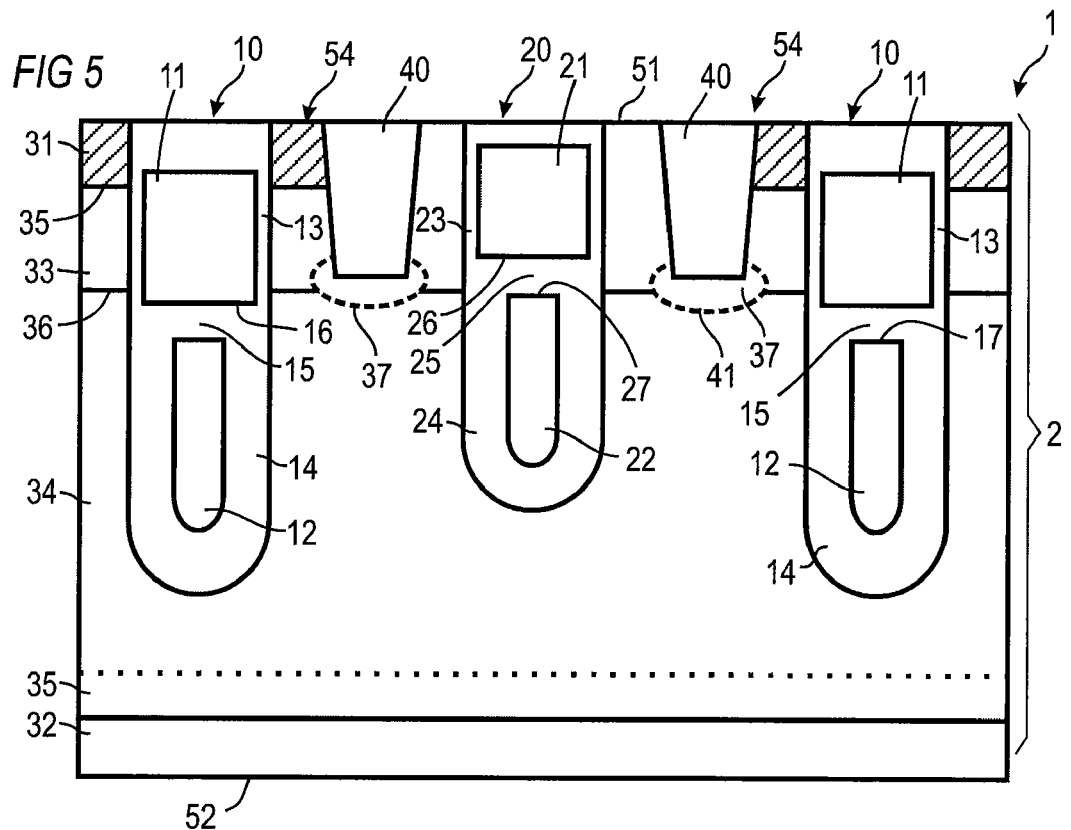
FIG. 5 shows a further embodiment of a semiconductor device.

Another embodiment is shown in FIG. 5 which includes a second trench 20 with a thin gate insulating layer 23 having substantially the same thickness as the gate insulating layer 13 of the first trench 10. However, since the drain region 31 does not laterally extend to the second trench 20 in this embodiment, the second trench 20 does not contribute to the load current during forward mode.

Close to and in contact with the drain region 32 is formed a field stop region 35 having a doping concentration which is between the doping concentration of the drift region 34 and the doping concentration of the drain region 32. The field stop region 35 is of the same conductivity as the drift region 34. Field stop layers are also used for IGBTs and form than a further pn-junction with the emitter region 32 of opposite conductivity.

Figure 6:
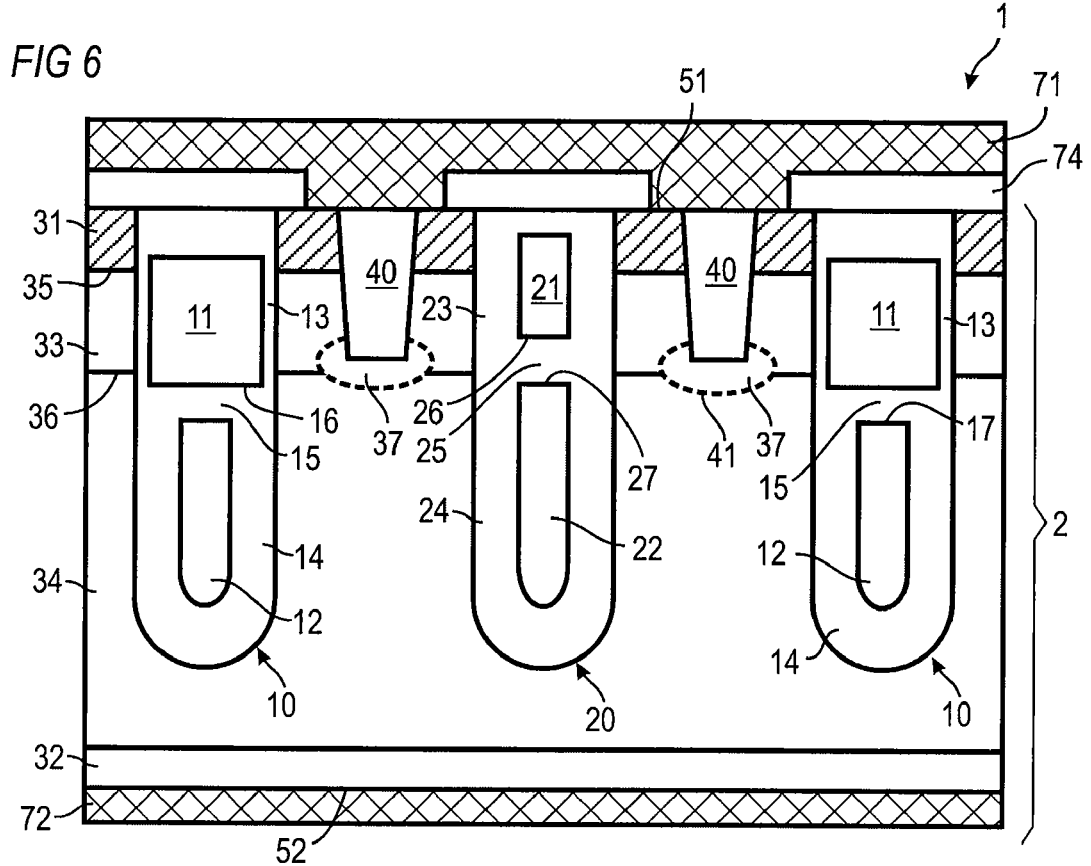
FIG. 6 shows yet a further embodiment of a semiconductor device.

FIG. 6 shows a further embodiment having an inactivated second trench 20 by using a gate insulating layer 23 having a thickness which is larger than the thickness of the gate insulating layer 13 of the first trench 10. This embodiment also shows a drain contact 72 formed at the second surface 52 and a source contact 71 formed at the first surface 51. Both, the drain and the source contacts 71, 72 are typically a metallization layer made of a suitable metal or an alloy. The source contact 71 can also be in electrical connection to the contact regions 40 and is insulated from the trenches 10, 20 by an insulating layer 74.

It goes without saying that the field stop layer 35 and the metallization layers 71 and 72 can also be combined with any other embodiments described herein.

Figure 7:
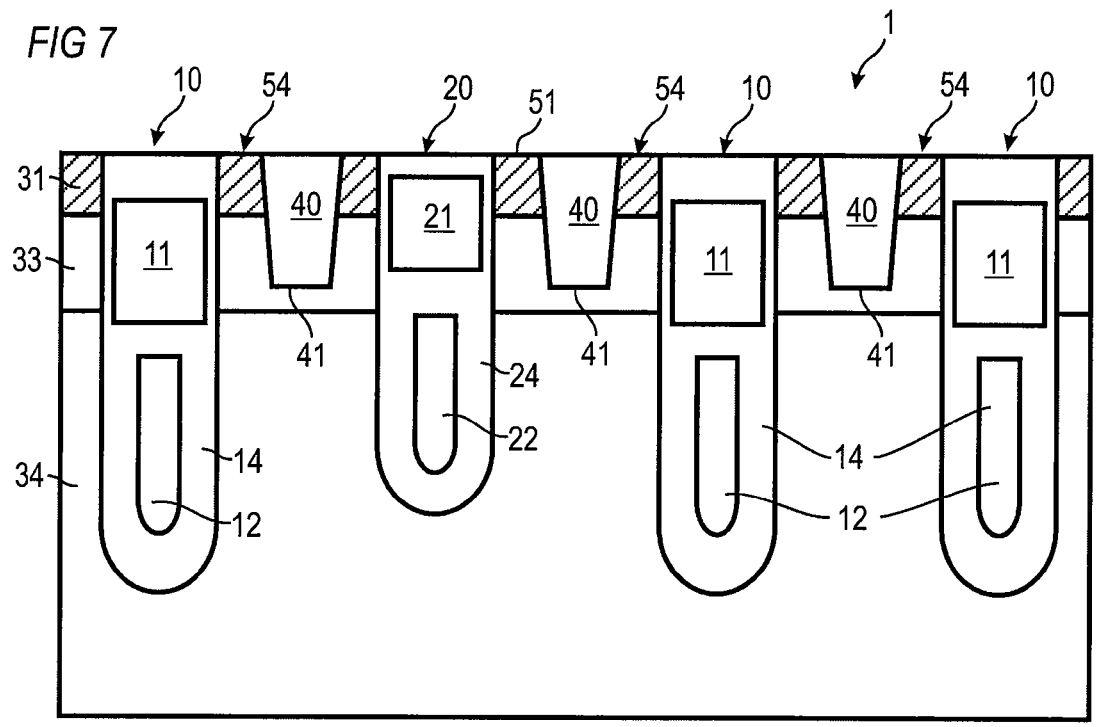
FIG. 7 shows another embodiment of a semiconductor device.

A further embodiment is shown in FIG. 7. Every third trench 20 of this semiconductor device 1 is adapted to be switchable so that about 33% of all trenches correspond to the second trenches 20. The structure of the first and second trenches 10, 20 and of the source region 31 corresponds to the respective structures as described in connection with FIG. 2. The optional highly doped regions 37 are not formed in this embodiment but can be if desired. In case that no highly doped regions 37 are formed, the lower face of the contact regions forms its lower edge 41.

Figure 8:
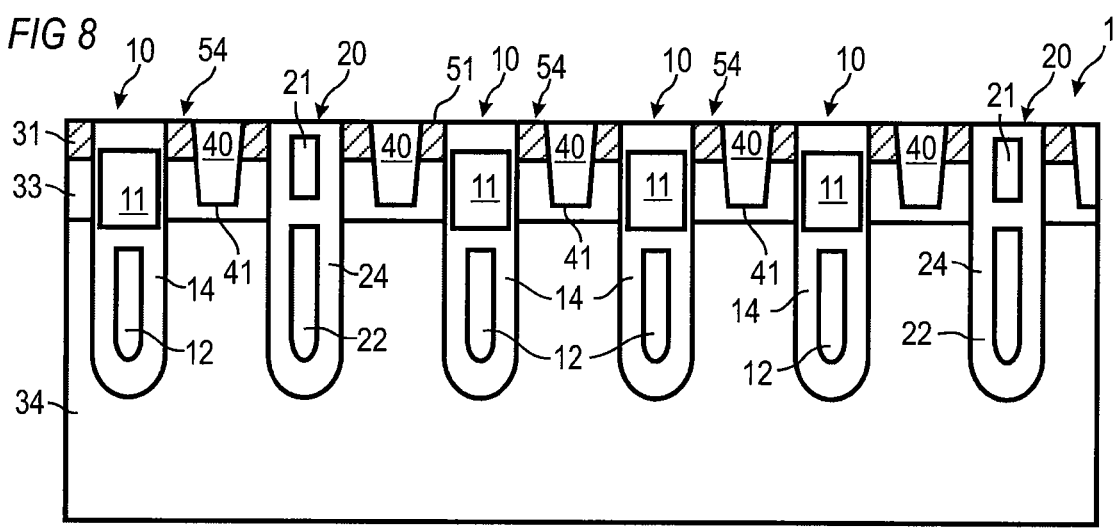
FIG. 8 shows a further embodiment of a semiconductor device.

FIG. 8 shows a semiconductor device 1 in which about 25% of all trenches are adapted to be switchable (every fourth trench). The switchable trenches (second trenches) 20 include a thick gate insulating layer which inactivates the second trenches 20 so that the second trenches 20 will not contribute to the load current in the forward mode.

For sake of simplicity, drain region 32, source contact 71, drain contact 72, control contact pad 73 and switching device 60 are not shown in FIGS. 7 and 8.

A method for manufacturing a semiconductor device will now be described in connection with FIGS. 12A to 12D.

Figure 12A:
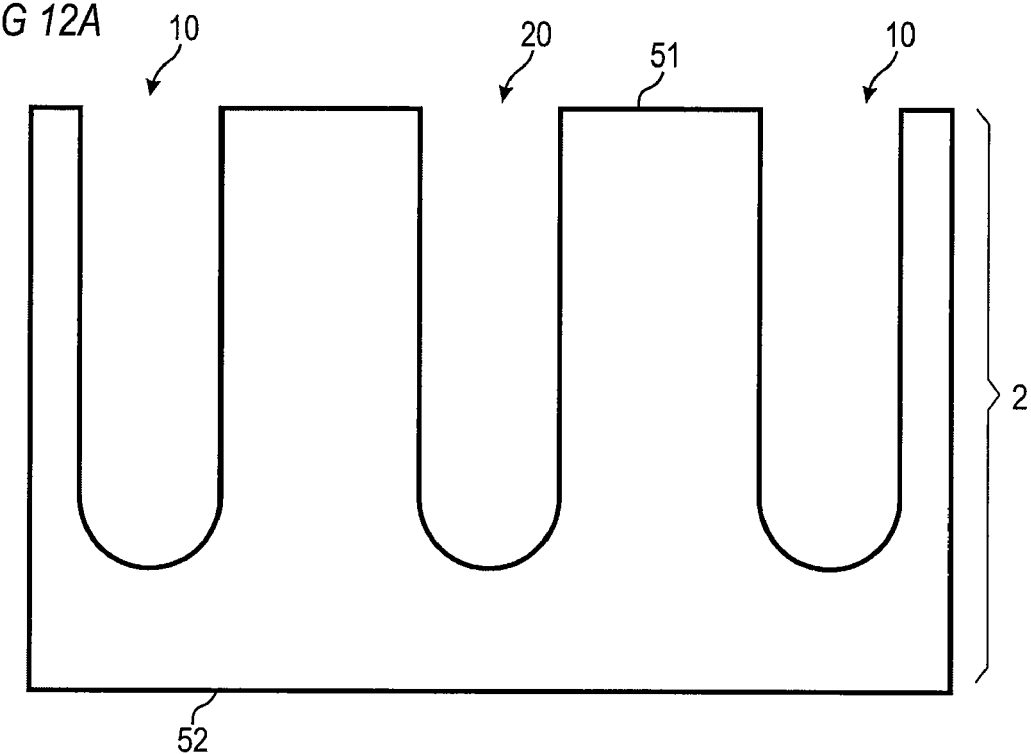
FIGS. 12A to 12D show steps of a method for manufacturing a semiconductor device according to an embodiment.
Figure 12B:
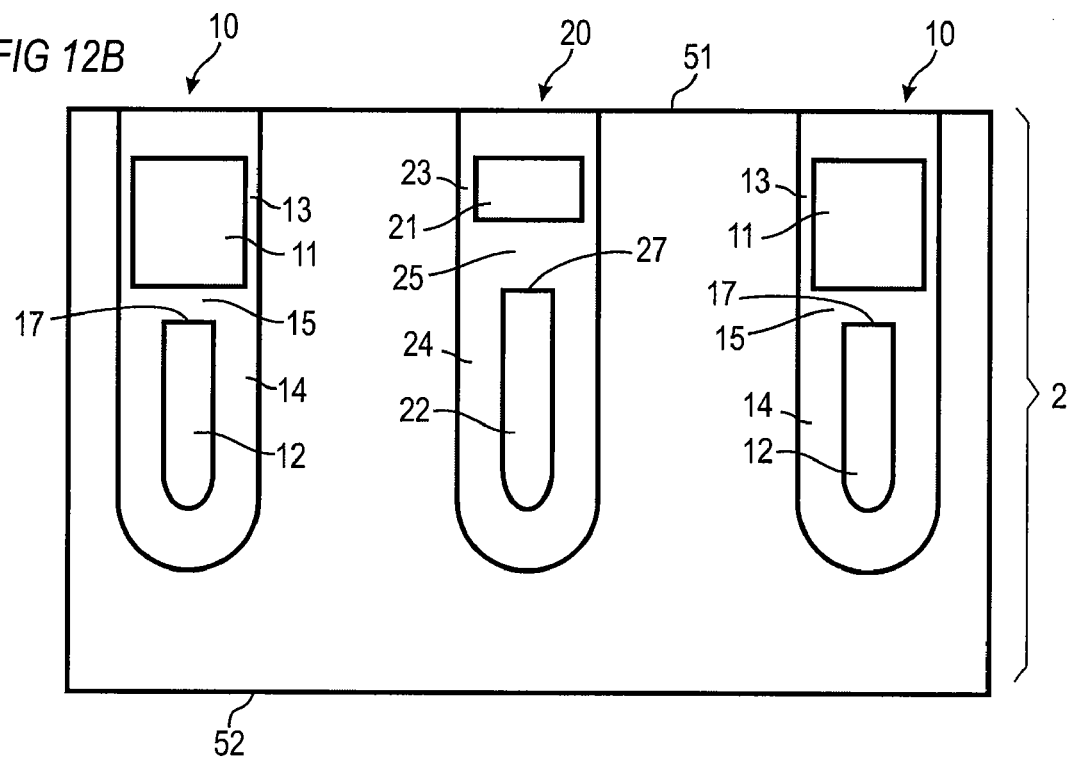

A semiconductor substrate 2 is provided and trenches 10, 20 are formed by anisotropic etching (FIG. 12A).

Then, the field insulating layers 14, 24 are formed by depositing an insulating material followed by formation of the field electrodes 12 and 22 respectively. The field electrodes 12, 22 can be made of highly doped polysilicon. The location of the upper edge 17, 27 of the respective field electrodes 12, 22 can be defined by different etching times used for back etching of the deposited polysilicon.

In a further step, the respective gate-field insulating layers 15, 25 are formed by depositing an insulating layer or oxidising upper portions of the field electrodes 12, 22, respectively. The gate-field insulating layers 15, 25 can have the same thickness, or the gate-field insulating layer 25 of the second trench 20 can be formed to have a thickness which exceeds the thickness of the gate-field insulating layer 15 of the first trenches 10. Different thicknesses can be achieved by separate deposition processes or by depositing an additional insulating layer into the second trenches 20.

In further steps, the gate insulating layers 13, 23 and the gate electrodes 11, 21 are formed.

Figure 12C:
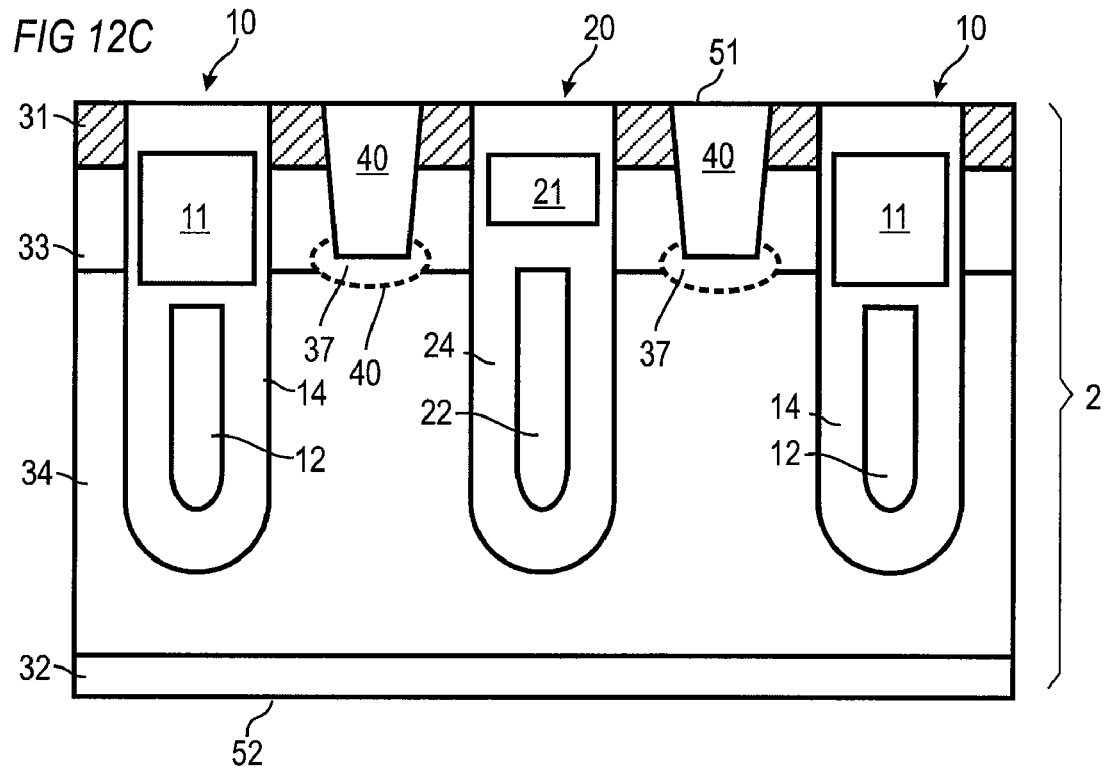

As shown in FIG. 12C the source, body and drain (emitter) regions 31, 33 and 32, respectively, are formed by implantation and thermal annealing. Also, the contact regions 40 are formed by etching openings into the mesa structures 54 and filling them with highly doped polysilicon. Highly doped regions 37 are formed by implantation before depositing the highly doped silicon.

The order of the above steps can be changed according to specific needs. For instance, source and body regions 31, 33 can be formed prior to formation of the trenches 10, or during intermediate steps at which the field electrodes 12, 22 or the gate electrode 11, 21 are not yet completed.

Figure 12D:
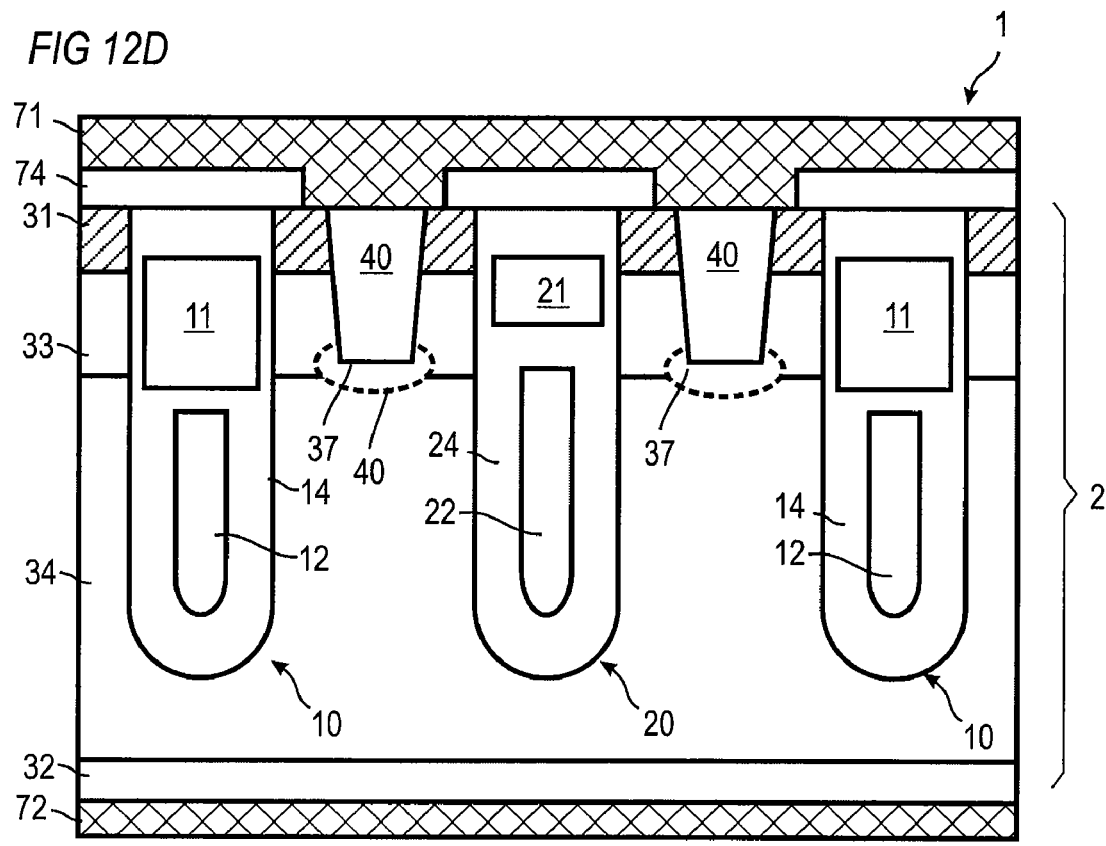

Finally, the drain contact 72, source contact 71 and control contact 73 are formed by depositing respective metal layers (FIG. 12D).

To summarise, the semiconductor device as described in some embodiments allows the dynamic change of its electrical properties by temporarily applying an electrical potential, which can substantially correspond to the drain potential, to field electrodes of selected trenches. These field electrodes are connected to a switching device which is adapted for switching between two electrical potentials. By doing so, the location of an avalanche breakdown can be shifted from the bottoms of the trenches to the contact regions. In other words, the semiconductor device can be switched between dense trench regime and field electrode regime.

In more general terms, a switchable field electrode is arranged close to a pn-junction to alter the breakdown characteristics of that pn-junction. The field electrode is switched between the electrical potentials which can be applied through a switching device.

A control contact pad, which is electrically connected to the field electrode arranged next to the pn-junction or the field electrodes of the switchable trenches and which is arranged on the semiconductor device, allows application of different electrical potentials through the switching device.

To improve reliability of the semiconductor device and to ensure that the avalanche breakdown occurs close to the contact region, the upper edge of the field electrode of the switchable trenches should be arranged above the lower edge of the contact region.

Furthermore, the gate-field insulating layer of the switchable trenches should be adjusted to withstand the high electrical field occurring during application of the drain potential to the field electrode. Typically, the gate-field insulating layer of the switchable trenches is thicker than the gate-field insulating layer of the other trenches.

The semiconductor device as described herein is not restricted to power applications but can be used for any application for which a change of the electrical properties of selective trenches is of desired.

The written description above uses specific embodiments to disclose the invention, including the best mode, and also to enable any person skilled in the art to make and use the invention. While the invention has been described in terms of various specific embodiments, those skilled in the art will recognise that the invention can be practiced with modifications within the spirit and scope of the claims. Especially, mutually non-exclusive features of the embodiments described above may be combined with each other. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A semiconductor device, comprising:
    a semiconductor substrate;
    at least a pn-junction arranged in the semiconductor substrate;
    at least a field electrode arranged at least next to a portion of the pn-junction, the field electrode being insulated from the semiconductor substrate; and
    a switching device comprising an output being electrically connected to the field electrode, a control terminal for controlling the switching device, a first input for electrically connecting to a first electrical potential, and a second input for electrically connecting to a second electrical potential, which is different from the first electrical potential, the switching device being adapted to apply selectively and dynamically one of the first electrical potential and the second electrical potential to the field electrode to alter the avalanche breakdown characteristics of the pn-junction.

2. The semiconductor device of claim 1, wherein the pn-junction comprises a breakdown-susceptible region, and wherein the field electrode is arranged at least next to the breakdown-susceptible region of the pn-junction.

3. The semiconductor device of claim 1, wherein the switching device comprises a control terminal for controlling the switching device.

4. The semiconductor device of claim 1, further comprising a doping region arranged in the semiconductor substrate, the doping region forming the pn-junction with an adjacent region in the semiconductor substrate, and further comprising a contact pad in electrical connection with the doping region, and a control contact pad in electrical connection with the field electrode.

5. The semiconductor device of claim 1, further comprising a source region, a body region and a drift region, the body and drift regions forming the pn-junction, further comprising a gate electrode arranged next to the body region.

6. The semiconductor device of claim 1, further comprising a trench formed in the semiconductor substrate, wherein the field electrode is arranged in the trench.

7. A semiconductor device, comprising:
    a semiconductor substrate comprising a first surface and a second surface arranged opposite to the first surface;
    a first doping region formed in the semiconductor substrate at the first surface;
    a second doping region formed in the semiconductor substrate at the second surface;
    at least a first trench formed in the semiconductor substrate and extending from the first surface into the semiconductor substrate, the first trench comprising a gate electrode and a field electrode;
    at least a second trench formed in the semiconductor substrate and extending from the first surface into the semiconductor substrate, the second trench being laterally spaced to the first trench and comprising at least a field electrode; and
    a switching device being electrically connected to the field electrode of the second trench and adapted to apply selectively and dynamically one of a first electrical potential, which substantially corresponds to the electrical potential of the first doping region, and a second electrical potential, which substantially corresponds to the electrical potential of the second doping region, to the field electrode of the second trench.

8. The semiconductor device of claim 7, wherein the switching device is adapted to connect selectively the field electrode of the second trench with one of the first and the second doping regions.

9. The semiconductor device of claim 7, wherein the field electrode of the first trench is electrically connected to the first doping region.

10. The semiconductor device of claim 7, wherein the semiconductor device comprises a control contact pad which is in electrical connection with the field electrode of the second trench, wherein the switching device is electrically connected to the control contact pad.

11. The semiconductor device of claim 7, wherein the second trench further comprises a gate electrode and each of the first and second trenches comprises a gate insulating layer for electrically insulating the respective gate electrodes from the semiconductor substrate.

12. The semiconductor device of claim 11, wherein the gate insulating layer of the second trench is thicker than the gate insulating layer of the first trench.

13. The semiconductor device of claim 7, further comprising a third doping region in contact with the first doping region, the third doping region being of opposite conductivity type to the first doping region.

14. The semiconductor device of claim 13, wherein a contact region is formed in the semiconductor substrate between adjacent trenches for providing an electrical connection to the third doping region.

15. The semiconductor device of claim 14, wherein the field electrode of the second trench comprises an upper edge which faces the first surface and which is arranged above a lower end of the contact region.

16. A method for manufacturing a semiconductor device, comprising:
provide a semiconductor substrate;
forming at least a pn-junction in the semiconductor substrate;
forming at least a field electrode arranged at least next to a portion of the pn-junction, the field electrode being insulated from the semiconductor substrate; and
forming a switching device comprising an output in electrical connection to the field electrode, a control terminal for controlling the switching device, a first input for electrically connecting to a first electrical potential, and a second input for electrically connecting to a second electrical potential, which is different from the first electrical potential, the switching device being adapted to apply selectively and dynamically one of the first electrical potential and the second electrical potential to the field electrode to alter the avalanche breakdown characteristics of the pn-junction.

17. The method of claim 16, wherein the semiconductor substrate comprises a first surface and a second surface arranged opposite to the first surface, the method further comprising:
forming at least a first and a second trench in the semiconductor substrate at the first surface in spaced relation to each other;
forming at least respective field electrodes in the first and second trenches; and
forming a first doping region in the semiconductor substrate at the first surface, a second doping region in the semiconductor substrate at the second surface, and a third doping region in contact with the first doping region and between the first and second doping regions, the third doping region being of opposite conductivity type to the first doping region and adjoining the pn-junction.

18. The method of claim 17, further comprising:
forming a contact region in the semiconductor substrate between adjacent trenches for providing an electrical connection to the third doping region; and
forming the field electrode of the second trench such that it comprises an upper edge which is arranged above a lower end of the contact region.

19. The method of claim 17, wherein each of the first and second trenches are formed such that they comprise a gate insulating layer for electrically insulating the respective gate electrodes from the semiconductor substrate, wherein the gate insulating layer of the second trench is formed to be at least partially thicker than the gate insulating layer of the first trench.

20. The method of claim 16, further comprising forming a control contact pad which is electrically connected to the field electrode.

* * * * *